United States Patent
Mahadeva et al.

(10) Patent No.: US 11,695,379 B2
(45) Date of Patent: Jul. 4, 2023

(54) APPARATUS AND METHOD FOR AUTOMATIC VOLUME CONTROL WITH AMBIENT NOISE COMPENSATION

(71) Applicant: ARRIS Enterprises LLC, Suwanee, GA (US)

(72) Inventors: Swaroop Mahadeva, Karnataka (IN); Chandra Shekar Ksheerasagar, Karnataka (IN); Jeethendra Poral, Karnataka (IN)

(73) Assignee: ARRIS ENTERPRISES LLC, Suwanee, GA (US)

( * ) Notice: Subject to any disclaimer, the term of this patent is extended or adjusted under 35 U.S.C. 154(b) by 0 days.

(21) Appl. No.: 17/557,869

(22) Filed: Dec. 21, 2021

(65) Prior Publication Data

US 2022/0182029 A1  Jun. 9, 2022

Related U.S. Application Data

(63) Continuation of application No. 17/128,616, filed on Dec. 21, 2020, now Pat. No. 11,239,810.

(Continued)

(51) Int. Cl.
*H03G 3/30* (2006.01)
*G10L 25/51* (2013.01)
(Continued)

(52) U.S. Cl.
CPC ........ *H03G 3/3005* (2013.01); *G10L 25/51* (2013.01); *G10L 25/78* (2013.01); *H04R 1/08* (2013.01); *H04R 2430/01* (2013.01)

(58) Field of Classification Search
None
See application file for complete search history.

(56) References Cited

U.S. PATENT DOCUMENTS 7,636,444 B2  12/2009 Cronin
10,674,265 B1 *  6/2020 Lee ........................ H03G 3/32
(Continued)

FOREIGN PATENT DOCUMENTS

| WO | 99/22366 | 5/1999 |
| WO | 2007/085267 | 8/2007 |

OTHER PUBLICATIONS

International Search Report dated Mar. 23, 2021 in International (PCT) Application No. PCT/US2020/066330.
(Continued)

*Primary Examiner* — Paul W Huber
(74) *Attorney, Agent, or Firm* — Wenderoth, Lind & Ponack, L.L.P.

(57) ABSTRACT

An electronic device and method that automatically adjusts an audio output volume level based on a live environmental acoustic scenario input via a microphone using a machine learning algorithm trained with Human Activity Recognition (HAR). Equipped with such an intelligence the electronic device classifies ambient sounds occurring in the environment of the listening area in which the device is situated into different acoustic scenario mappings such a voice or conversation, for an ambient human conversation detected event, and noise, such as for example a vacuum cleaner or dish washer noise detected event, and automatically adjust the audio output volume accordingly.

9 Claims, 7 Drawing Sheets

Related U.S. Application Data

(60) Provisional application No. 62/955,029, filed on Dec. 30, 2019.

(51) Int. Cl.
  *G10L 25/78* (2013.01)
  *H04R 1/08* (2006.01)

(56) References Cited

U.S. PATENT DOCUMENTS

| | | |
|---|---|---|
| 11,003,414 B2* | 5/2021 | Choi .................. G10L 21/0316 |
| 11,323,086 B2* | 5/2022 | Friant .................... H03G 3/32 |
| 2004/0218768 A1 | 11/2004 | Zhurin et al. |
| 2011/0051016 A1 | 3/2011 | Malode |
| 2016/0211817 A1 | 7/2016 | Krishnaswamy |

OTHER PUBLICATIONS

International Preliminary Report on Patentability dated Jul. 5, 2022 in International (PCT) Application No. PCT/US2020/066330.

* cited by examiner

FIG. 6

| Sl. No. | Modified DialNorm setting in dBFS | Desired Volume level (0-MUTE – 31-MAX) |
|---|---|---|
| 1 | 0 | 0　　　　　　　MUTE |
| 2 | -1 dBFS | 1 – Volume level |
| 3 | -5 dBFS | 5 – Volume level |
| 4 | -10 dBFS | 10 – Volume level　NORMAL |
| 5 | -20 dBFS | 20 – Volume level |
| 6 | -31 dBFS | 31 – Volume level - MAX |

FIG. 7

| Audio Output Profile | Output Dynamic Range | Output Volume Level |
|---|---|---|
| Quiet | 0 dB to 15 dB | 0 (Minimum) |
| Soft | 15 dB to 50 dB | 7 |
| Normal | 50 dB to 70 dB | 15 |
| Loud | 70 dB to 120 dB | 22 |
| Blast | 120 dB to 140 dB | 30 (Maximum) |

APPARATUS AND METHOD FOR AUTOMATIC VOLUME CONTROL WITH AMBIENT NOISE COMPENSATION

BACKGROUND

A listening area, such as a living room, in which a television outputs audio content experiences different acoustical variations which requires the user to adjust the audio output volume appropriately. For example the user needs to raise to volume to compensate for ambient noise in the listening area, or lower the volume in order to have a comfortable conversation with others in the room or on a telephone. Thus, an automated method for audio volume control is beneficial.

Known prior art automatic volume control apparatuses have shortcomings as discussed below.

U.S. Pat. No. 4,476,571 proposes an automatic volume control methodology for a car stereo or the like which adjusts the volume according to an environmental noise level includes a microphone and a low pass filter circuit to smooth volume transients in case the environmental noise sharply increases. This proposed technique does not employ a machine learning audio processing methodology and is hence unable to differentiate between a human conversation or a noise. This proposed technique is also not suitable for living room environment which is sensitive to subtle changes in the acoustic environment.

U.S. Pat. No. 7,333,618 discloses systems and methods for ambient noise compensation. One example of a system includes a variable amplifier, a source sound processor, an area sound processor, and an adjustment circuit. The variable amplifier adjusts an audio input signal to generate an audio output signal with an appropriate level so that the audio output signal is audible over noise in a listening area. The source sound processor and the area sound processor may split the audio output signal and a monitoring signal into frequency bands, and may compare these signals band-by band to find differences that represent time-varying noise in the monitoring signal. These differences may be modified to account for the acoustic response of the listening area and for constant-level background noise in the listening area. The adjustment circuit controls the variable amplifier in response to these differences. These systems use electronic circuitry for controlling the level of a desired sound signal to compensate for noise in a listening area. The methods and systems measure the level of a monitoring signal, such as a microphone signal, that is a combination of a desired source sound and undesired noise, and then calculate a noise level by subtracting a source signal level from the microphone signal level. The implementation includes a source input stage, a microphone input stage, and a crossover circuit, which implement the source input, the microphone input, and the sound output, respectively. A stereo voltage-controlled amplifier (VCA) and a makeup gain amplifier serve as interconnected components of the variable amplifier. A filter bank, a running-average block, and a logarithm block may be connected in series, and serve as components of the source sound processor.

U.S. Pat. No. 8,032,385 discloses a method for correcting metadata affecting the playback loudness of audio information, and attempts to solve the problem of extreme variations in the loudness of the audio in radio and television broadcasts and in pre-recorded audio material. Large variations in loudness often occur as listeners tune from one station to another, as the program received from a given station switches between a main feature and commercial advertisements, and as listeners change media in their playback systems such as switching between different compact discs or different DVDs. Listeners are often forced to adjust the volume controls of their receivers and playback systems to maintain a relatively uniform loudness. One solution that has been proposed to overcome this problem is the use of control information or "metadata" that accompanies the audio information. Metadata, or data that describes the audio data, may be provided in a broadcast or recorded signal to control the playback loudness of the audio information. One example of this type of metadata is described in the Advanced Television Systems Committee (ATSC) A/52A document entitled "Revision A to Digital Audio Compression (AC-3) Standard" published Aug. 20, 2001. This particular standard specifies metadata that includes the parameters, DIALNORM, COMPR and DYNRNG, which pertain to playback signal level and dynamic range. Both signal level and dynamic range affect the perceived or subjective level of a signal, which is referred to as loudness. Receivers that conform to this ATSC audio standard use the DIALNORM parameter to control playback signal levels, and may use the COMPR and DYNRNG parameters to control compression of playback signal dynamic range. If this type of metadata is used properly during audio content creation, distribution, broadcast and recording processes, the problem with excessive variations in playback loudness could be eliminated or at least greatly reduced. Unfortunately, metadata is sometimes misused or not used at all because it is misunderstood, because the appropriate people do not know how to use it properly, or because it is used to create artistic effects in inappropriate ways. The object of the disclosure of U.S. Pat. No. 8,032,385 is to identify the incorrect meta data information encoded in the audio information produced by an encoding process; obtains decoded audio information from an application of a decoding process to the input signal; obtains a measure of loudness from an analysis of the decoded audio information and derives a second loudness normalization level that provides the measure of the corrected loudness.

SUMMARY

A first aspect of the present disclosure is an automatic volume control apparatus for automatically controlling an output volume of audio content, including a memory having stored therein a plurality of profiles, $P_x$, where x is an integer 1 to n, n being greater than 1, ranging from a quietest profile $P_1$ to a loudest profile $P_n$, associated with volume settings, respectively, and having stored therein, for each profile respectively, a decibel range and an upper sound limit value; a microphone, a processor configured to execute at least the following: receiving a user volume setting, the user volume setting having an associated profile $P_y$, which corresponds to one of the profiles $P_x$, y=1 to n; setting an output volume of the audio content to a volume setting having the profile $P_x$ corresponding to the profile $P_y$ indicated by the user volume setting; receiving sound input from the microphone; determining whether the sound input from the microphone has an intensity that exceeds the upper sound limit value of the profile $P_y$ indicated by the user volume setting; if the processor determines that the sound input from the microphone exceeds the upper sound limit value of the profile indicated by the user volume setting, performing an analysis of the sound input from the microphone to determine whether the sound input from the microphone includes noise or an ambient voice; if the processor determines that the sound input from the microphone includes noise or an ambient voice, changing the output volume of the audio content to a volume setting having a profile different from $P_y$.

A second aspect is that the processor is further configured to execute the following: if the processor determines that the sound input from the microphone includes noise, raising the output volume of the audio content to a volume setting having a profile higher than $P_y$.

A third aspect is that the processor is further configured to execute the following: if the processor has determined that the sound input from the microphone has an intensity that exceeds the upper sound limit value of the profile $P_y$ indicated by the user volume setting and that the sound input from the microphone includes noise, raising the output volume of the audio content to a volume setting having a profile $P_{y+1}$.

A fourth aspect is that the processor is further configured to execute the following: if the processor has determined that the sound input from the microphone has an intensity that exceeds the upper sound limit value of the profile $P_y$ indicated by the user volume setting and that the sound input from the microphone includes noise, raising the output volume of the audio content to a volume setting having a profile that has a decibel range that encompasses the intensity of the sound input from the microphone and an upper sound limit value that is greater than the intensity of the sound input from the microphone.

A fifth aspect is that the processor is further configured to execute the following: if the processor determines that the sound input from the microphone includes an ambient voice, lowering the output volume of the audio content to a volume setting having a profile lower than $P_y$.

A sixth aspect is that the processor is further configured to execute the following: if the processor has determined that the sound input from the microphone has an intensity that exceeds the upper sound limit value of the profile $P_y$ indicated by the user volume setting and that the sound input from the microphone includes an ambient voice, lowering the output volume of the audio content to a volume setting having a profile $P_1$.

A seventh aspect is that the processor is further configured to execute the following: if the processor has determined that the sound input from the microphone has an intensity that exceeds the upper sound limit value of the profile $P_y$ indicated by the user volume setting and that the sound input from the microphone includes an ambient voice, lowering the output volume of the audio content to a volume setting having a profile that has a decibel range that encompasses the intensity of the sound input from the microphone and that has an upper sound limit value that is greater than the intensity of the sound input from the microphone.

An eighth aspect is an automatic volume control method for automatically controlling an output volume of audio content, comprising: storing in a memory a plurality of profiles, $P_x$, where x is an integer 1 to n, n being greater than 1, ranging from a quietest profile $P_1$ to a loudest profile $P_n$, associated with volume settings, respectively, and having stored therein, for each profile respectively, a decibel range and an upper sound limit value; receiving a user volume setting, the user volume setting having an associated profile $P_y$, which corresponds to one of the profiles $P_x$, y=1 to n; setting an output volume of the audio content to a volume setting having the profile $P_x$ corresponding to the profile $P_y$ indicated by the user volume setting; receiving sound input from the microphone; determining, with a processor, whether the sound input from the microphone has an intensity that exceeds the upper sound limit value of the profile $P_y$ indicated by the user volume setting; if the processor determines that the sound input from the microphone exceeds the upper sound limit value of the profile indicated by the user volume setting, performing, with the processor, an analysis of the sound input from the microphone to determine whether the sound input from the microphone includes noise or an ambient voice; if the processor determines that the sound input from the microphone includes noise or an ambient voice, automatically changing the output volume of the audio content to a volume setting having a profile different from $P_y$.

A ninth aspect is that the method includes: if the processor determines that the sound input from the microphone includes noise, automatically raising the output volume of the audio content to a volume setting having a profile higher than $P_y$.

A tenth aspect is that the method includes: if the processor has determined that the sound input from the microphone has an intensity that exceeds the upper sound limit value of the profile $P_y$ indicated by the user volume setting and that the sound input from the microphone includes noise, automatically raising the output volume of the audio content to a volume setting having a profile $P_{y+1}$.

An eleventh aspect is that the method includes: if the processor has determined that the sound input from the microphone has an intensity that exceeds the upper sound limit value of the profile $P_y$ indicated by the user volume setting and that the sound input from the microphone includes noise, automatically raising the output volume of the audio content to a volume setting having a profile that has a decibel range that encompasses the intensity of the sound input from the microphone and that has an upper sound limit value that is greater than the intensity of the sound input from the microphone.

A twelfth aspect is that the method includes: if the processor determines that the sound input from the microphone includes an ambient voice, automatically lowering the output volume of the audio content to a volume setting having a profile lower than $P_y$.

A thirteenth aspect is that the method includes: if the processor has determined that the sound input from the microphone has an intensity that exceeds the upper sound limit value of the profile $P_y$ indicated by the user volume setting and that the sound input from the microphone includes an ambient voice, automatically lowering the output volume of the audio content to a volume setting having a profile $P_1$.

A fourteenth aspect is that the method includes: if the processor has determined that the sound input from the microphone has an intensity that exceeds the upper sound limit value of the profile $P_y$ indicated by the user volume setting and that the sound input from the microphone includes an ambient voice, automatically lowering the output volume of the audio content to a volume setting having a profile that has a decibel range that encompasses the intensity of the sound input from the microphone and that has an upper sound limit value that is greater than the intensity of the sound input from the microphone.

A fifteenth aspect is a non-transitory computer readable medium having stored thereon a program that causes a processor to execute an automatic volume control method for automatically controlling an output volume of audio content, comprising: storing in a memory a plurality of profiles, $P_x$, where x is an integer 1 to n, n being greater than 1, ranging from a quietest profile $P_1$ to a loudest profile $P_n$, associated with volume settings, respectively, and having stored therein, for each profile respectively, a decibel range and an upper sound limit value; receiving a user volume setting, the user volume setting having an associated profile $P_y$, which corresponds to one of the profiles $P_x$, y=1 to n; setting an output volume of the audio content to a volume setting having the profile $P_x$ corresponding to the profile $P_y$ indicated by the user volume setting; receiving sound input from the microphone; determining, with a processor, whether the sound input from the microphone has an intensity that exceeds the upper sound limit value of the profile $P_y$ indicated by the user volume setting; if the processor determines that the sound input from the microphone exceeds the upper sound limit value of the profile indicated by the user volume setting, performing, with the processor, an analysis of the sound input from the microphone to determine whether the sound input from the microphone includes noise or an ambient voice; if the processor determines that the sound input from the microphone includes noise, automatically raising the output volume of the audio content to a volume setting having a profile higher than $P_y$; if the processor determines that the sound input from the microphone includes an ambient conversation, automatically lowering the output volume of the audio content to a volume setting having a profile lower than $P_y$.

A sixteenth aspect is that the program causes the processor to further execute the following: if the processor determines that the sound input from the microphone includes noise, automatically raising the output volume of the audio content to a volume setting having a profile higher than $P_y$.

A seventeenth aspect is that the program causes the processor to further execute the following: if the processor has determined that the sound input from the microphone has an intensity that exceeds the upper sound limit value of the profile $P_y$ indicated by the user volume setting and that the sound input from the microphone includes noise, automatically raising the output volume of the audio content to a volume setting having a profile $P_{y+1}$.

An eighteenth aspect is that the program causes the processor to further execute the following: if the processor has determined that the sound input from the microphone has an intensity that exceeds the upper sound limit value of the profile $P_y$ indicated by the user volume setting and that the sound input from the microphone includes noise, automatically raising the output volume of the audio content to a volume setting having a profile that has a decibel range that encompasses the intensity of the sound input from the microphone and that has an upper sound limit value that is greater than the intensity of the sound input from the microphone.

A nineteenth aspect is that the program causes the processor to further execute the following: if the processor determines that the sound input from the microphone includes an ambient voice, automatically lowering the output volume of the audio content to a volume setting having a profile lower than $P_y$.

A twentieth aspect is that the program causes the processor to further execute the following: if the processor has determined that the sound input from the microphone has an intensity that exceeds the upper sound limit value of the profile $P_y$ indicated by the user volume setting and that the sound input from the microphone includes an ambient voice, automatically lowering the output volume of the audio content to a volume setting having a profile $P_1$.

A twenty-first aspect is that the program causes the processor to further execute the following: if the processor has determined that the sound input from the microphone has an intensity that exceeds the upper sound limit value of the profile $P_y$ indicated by the user volume setting and that the sound input from the microphone includes an ambient voice, automatically lowering the output volume of the audio content to a volume setting having a profile that has a decibel range that encompasses the intensity of the sound input from the microphone and that has an upper sound limit value that is greater than the intensity of the sound input from the microphone.

A twenty-second aspect is that the analysis to determine whether the sound includes noise or an ambient voice, according to any of the above aspects, includes a deep learning algorithm.

BRIEF DESCRIPTION OF THE DRAWINGS

FIG. 6 illustrates modified DialNorm values and corresponding desired volume levels for automatic volume control by the electronic device.

FIG. 7 is illustrates examples of audio output profiles and corresponding dynamic ranges and output volume levels for automatic volume control by the electronic device.

DETAILED DESCRIPTION

Disclosed herein are apparatuses and methods for ambient noise compensation and automatic output volume adjustments for a CPE (Consumer Premises Equipment) device, such as a television, a smart media device, or a set top box for a television, according to the environmental acoustic scenario in the listening area. Audio in the listening area of the CPE device is input via an acoustic sensory device such as a microphone. Electronic circuits of processors monitor the dynamically changing acoustical scenario in the listening area. The apparatuses and methods also employ deep-learning based algorithms to identify and categorize different acoustical scenarios and perform different actions accordingly, such as if detecting a baby crying, then lower the volume, if detecting a dish washer noise or a dog barking, then increase the volume, if detecting a family conversation, then lower the volume, etc.

The methods and apparatuses disclosed herein provide automatic volume control of a user device, such as a smart media device or set top box for a television, that includes a microphone, such that it automatically adjusts the audio output volume level based on the perceived live environmental acoustic scenario. Further to recognize the different acoustical living room scenarios the proposed method also includes a machine learning algorithm that is trained with the currently popular research topic Human Activity Recognition (HAR). Equipped with such an intelligence the methods and apparatuses disclosed herein are able to classify ambient sound (sounds occurring in the environment of the listening area in which the device is situated) into different acoustic scenario mappings such as a voice or conversation (for an ambient human conversation detected event) and noise (such as for example a vacuum cleaner or dish washer noise detected event) and automatically adjust the audio output volume of the device accordingly. For example, the apparatus will automatically lower or mute the audio volume if a human conversation is detected, or it will automatically increase the output volume level to a sufficiently higher output level to compensate for a detected ambient noise in order to maintain a perceived television audio output intensity level in the listening area.

Figure 1:
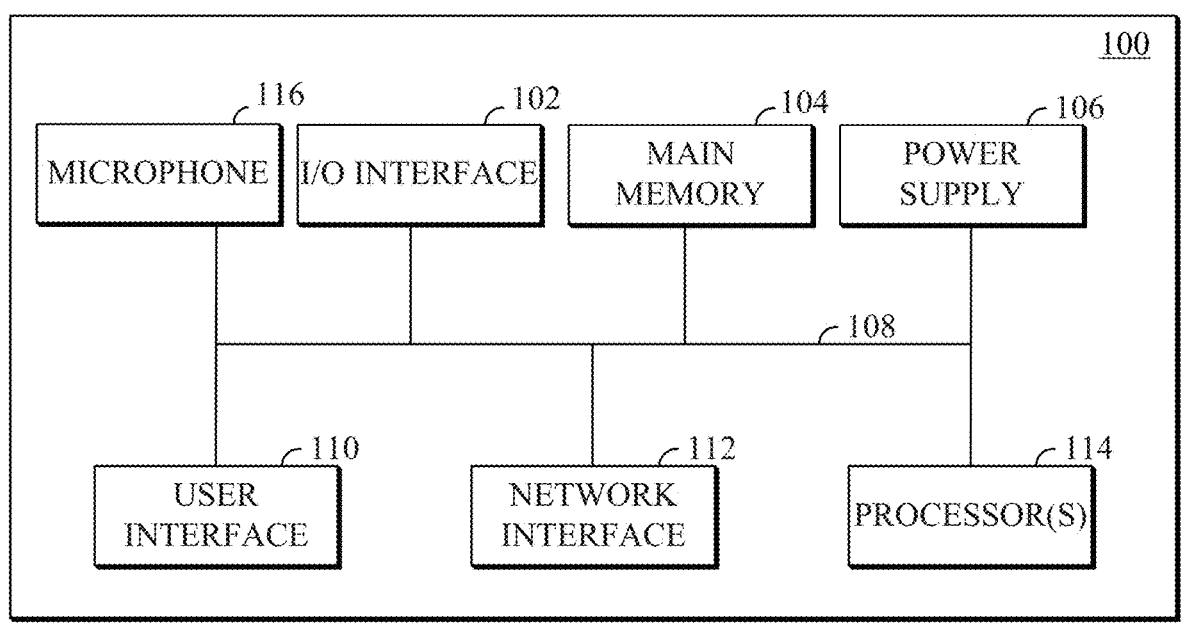
FIG. 1 is a block diagram of an embodiment of an electronic device for automatic volume control.

FIG. 1 is a block diagram of an exemplary implementation of an electronic device 100 (such as a smart media device, or set top box) according to an aspect of the present disclosure. The electronic device 100 includes electronic components or electronic computing devices operable to receive, transmit, process, store, and/or manage data and information associated with the systems and methods described herein, which encompasses any suitable processing device adapted to perform computing tasks consistent with the execution of computer-readable instructions stored in memory or a computer-readable recording medium.

As illustrated in FIG. 1, the exemplary electronic device 100 includes one or more memories or memory locations including a memory 104 as well as an input/output (I/O) interface 102, a user interface 110, a network interface 112, one or more processors 114, one or more microphone(s) 116, and an optional power supply 106. The memory 104 can be any known electronic memory, such as a random access memory (RAM), a memory buffer, a hard drive, an erasable programmable read only memory (EPROM), an electrically erasable programmable read only memory (EEPROM), a read only memory (ROM), or a flash memory.

The memory 104 can be used to store software and data, including any type of instructions associated with algorithms, processes, or operations for controlling the general functions of the electronic device 100 as well as any operating system, such as Linux, UNIX, Windows Server, or other customized and proprietary operating systems.

The optional power supply 106 can be used to power the various components of the electronic device 100. The power supply 106 can be self-contained, such as a battery pack, and/or the power supply 106 can include an interface to be powered through an electrical outlet.

The I/O interface 102 can be an interface for enabling the transfer of information between the electronic device 100 and external devices connected to the electronic device 100 that need special communication links for interfacing with the one or more processors 114. The I/O interface 102 can be implemented to accommodate various connections to the electronic device 100 that include, but are not limited to, a universal serial bus (USB) connection, parallel connection, a serial connection, coaxial connection, a High-Definition Multimedia Interface (HDMI) connection, or other known connection in the art connecting to external devices.

The user interface 110 enables communication between a user and the electronic device 100. The user interface 110 includes, but is not limited to, a mouse, a keyboard, a liquid crystal display (LCD), cathode ray tube (CRT), thin film transistor (TFT), light-emitting diode (LED), high definition (HD) or other similar display device with touch screen capabilities, and can include HAR interfaces for cameras and microphone(s) 116 and/or inputs via a display (onboard or via an attached display such as a television through use of the mouse, or keyboard, or via gesture recognition). The network interface 112 is a software and/or hardware interface implemented to establish a connection between the electronic device 100 and another processing device on a network, such as for cloud processing of deep-learning algorithms according to one or more aspects of the present disclosure. The network interface 104 includes software and/or hardware interface circuitry for establishing communication connections using either wired or wireless connections for establishing connections to, for example, a local area networks (LANs), wide area networks (WANs), metropolitan area networks (MANs), personal area networks (PANs), wireless local area networks (WLANs), system area networks (SANs), and other similar networks.

The one or more processors 114 control the general operations of the electronic device 100. Each one or the one or more processors 114 can be, but are not limited to, a central processing unit (CPU), a hardware microprocessor, a multi-core processor, a single core processor, a field programmable gate array (FPGA), an application specific integrated circuit (ASIC), a digital signal processor (DSP), or other similar processing device capable of executing instructions, algorithms, or software for controlling the operation of the electronic device 100. Communication between the components of the electronic device 100 (e.g., 102, 104, 106, 110, 112, and 114) is accomplished via an internal bus 108.

The electronic device 100 includes at least one microphone 116 for sensing acoustic information from the environmental surroundings. The sounds sensed by the microphone 116 are utilized by deep learning-based audio processing methodologies or algorithms that include features such as acoustic feature extraction, acoustic feature classification. The deep learning algorithm or algorithms are stored in the memory 104, and executed by the one or more processors 114, or can be external and accessed in a cloud platform (network or internet based storage memory and/or computers/processors) via the network interface 112. Such external algorithms can be proprietary and customized, or can be open source algorithms, and include human activity feature training data sets for training the algorithms to perform the tasks described herein for acoustic feature extraction and acoustic feature classification. An example of an open source algorithm is the so called AudioSet by Google, which is a large collection of labelled audio taken from Youtube videos (10 s excerpts). Other examples include the ESC-50 dataset with 2000 recordings, 40 from each class covering many everyday sounds. Other stored or cloud accessible algorithms include acoustic intensity measuring algorithms for measuring the live environmental acoustic intensity level information.

As discussed in detail below, stored in the memory 104 are predetermined audio level profiles, which are decibel (dB) bands within which the output volume of the controlled device operates. Controlled device refers to the fact that the electronic device 100 may have onboard speakers for outputting the sound of the audio content (or audio/video content), or the electronic device 100 can control the output of a connected device such as a television. Thus the controlled device can be the electronic device 100 itself or some other device such as a television that has an audio output that is controlled by the electronic device 100 (by controlling an operation of the device or by manipulation of values in a digital audio signal).

For each user selectable volume setting of the controlled device, there is a stored profile having a predetermined dB band within which the output sound is expected to reside. The electronic device senses the output sound, combined with any ambient sounds, via the at least one microphone 116. Without any ambient sounds, the audio output of the content being played (reproduced) sensed via a microphone 116 will fall within the corresponding dB band of the user selected volume setting. Each band has an upper dB threshold. When the processor 114 detects that the sensed sound exceeds the dB threshold of the band corresponding to the selected volume setting, the processor determines that there is some type of ambient sound in the room that requires some action and triggers execution of an algorithm to determine the proper course of action depending on the nature of the sensed sound. The expected dB bands of the profiles can be predetermined by testing the dB levels that result while each profile is implemented while playing a predetermined sounds or randomized audio content over the course of a testing time period in an environment that does not include ambient noise that would affect the testing.

For an example of the electronic device in use, consider the controlled device to be a television. If the sound on the television is the sound of a person using a vacuum cleaner, and in listening area there is an ambient sound of a person talking, and these combined sounds cause the sound sensed via the microphone 116 to exceed the upper dB threshold of the band corresponding to currently in-effect volume setting, the processor 114, through execution of an algorithm according to the descriptions in the present disclosure, recognizes that there is an ambient conversation occurring in the room (i.e., in the listening area in which the electronic device/television are located) and therefore proceeds to lower the volume to a profile having a next-lower dB band below the band corresponding to the in-effect volume setting (or alternatively, automatically to the lowest profile).

A second, different, result occurs if, alternatively, the sound on the television is the sound of a person using a vacuum cleaner, and in listening area there is an ambient sound (ambient noise) of a vacuum cleaner being used, and these combined sounds cause the sound sensed via the microphone 116 to exceed the upper dB threshold of the band corresponding to currently in-effect volume setting, the processor, through execution of the algorithm, recognizes that there is an ambient noise occurring in the room (i.e., in the listening area in which the electronic device/television are located) and therefore proceeds to raise the volume to a profile having a next-higher dB band above the band corresponding to the in-effect volume setting.

A third, different, result occurs if, alternatively, the sound on the television is the sound of a person talking, and in the listening area there is an ambient sound of an actual person also talking (to another person in the room or on a telephone for example), and these combined sounds cause the sound sensed via the microphone 116 to exceed the upper dB threshold of the band corresponding to currently in-effect volume setting, the processor, through execution of the algorithm, recognizes that there is an ambient sound occurring in the room (i.e., in the listening area in which the electronic device/television are located) and therefore proceeds to lower the volume to a profile having a next-lower dB band below the band corresponding to the in-effect volume setting (or to the lowest profile).

A fourth, different, result occurs if, alternatively, the sound on the television is the sound of a person talking, and in the listening area there is an ambient sound (ambient noise) of a vacuum cleaner being used, and these combined sounds cause the sound sensed via the microphone 116 to exceed the upper dB threshold of the band corresponding to currently in-effect volume setting, the processor, through execution of the algorithm, recognizes that there is an ambient noise occurring in the room (i.e., in the listening area in which the electronic device/television are located) and therefore proceeds to raise the volume to a profile having a next-higher dB band above the band corresponding to the in-effect volume setting. Specific details of how the algorithm recognizes that the noise is in the room and the talking is resulting from the played back audio content will be evident from discussions below.

As can be seen from the above general example scenarios, electronic device 100 can address the following contextual scenarios: (a) Conversation detected scenario: perform audio mute or lower the audio output volume if a human conversation is detected in the environment. Envisioned use-case scenario such as: (i) TV viewer has shifted their attention away from TV to answer the phone; (ii) TV viewer is having a conversation with other family members; and (b) Noise detected scenario: Increase the audio output volume to compensate for the externally detected noise in order to maintain its own perceived television audio output quality for the listening area where the electronic device 100 is installed.

Figure 2:
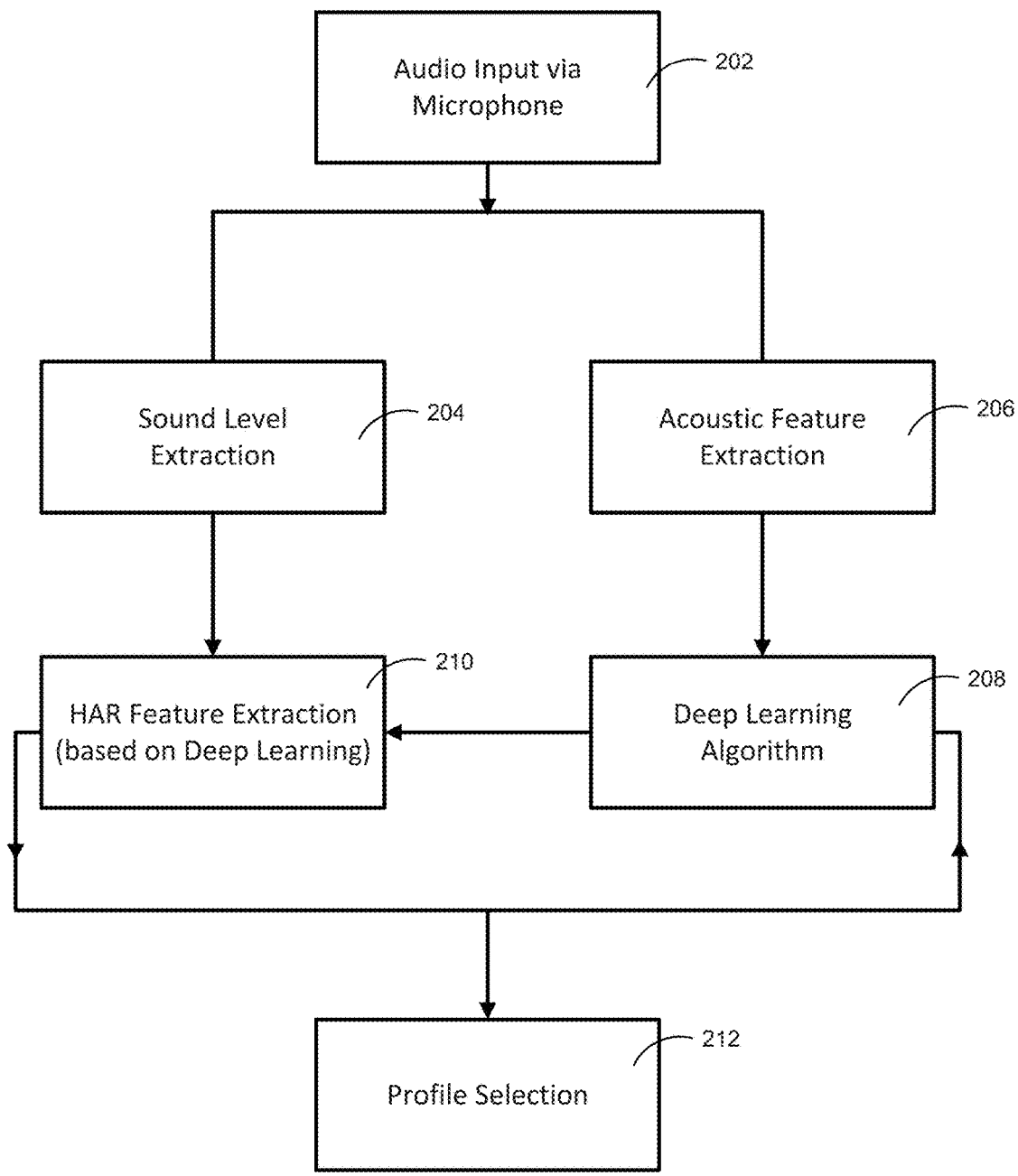
FIG. 2 is a flowchart of an example algorithm of processing executed by the electronic device.

FIG. 2 depicts processing blocks executed by the processor 114 and other components of the electronic device 100. The processing is designed to suit a typical living room setup for a family, e.g., 2 to 10 members, viewing a digital television that provides a digital output audio. The design however is not limited by the above constraint and can be suitably extended to a larger setup involving more people.

As shown in FIG. 2, at block 202, audio is input to the electronic device 100 via the microphone 116, and the processing proceeds to sound level extraction 204 and acoustic feature extraction 206, then to a learning loop of the deep learning algorithm 208 and Human Activity Recognition (HAR) feature extraction 210, followed ultimately by the profile selection 212 in which the audio profile is selected, i.e., changed.

The dynamic range of the digital audio output is typically in the range from 0 dB to 140 dB. For example a digital audio of 16 bit depth can describe a maximum dB output range up to 96 dB, a digital audio of 24 bit depth can describe a maximum dB output range up to 44 dB and so on. In the present embodiment, consider that the dynamic range for the audio output of typical digital television is 0 dB to 140 dB as shown in FIG. 3.

Figure 3:
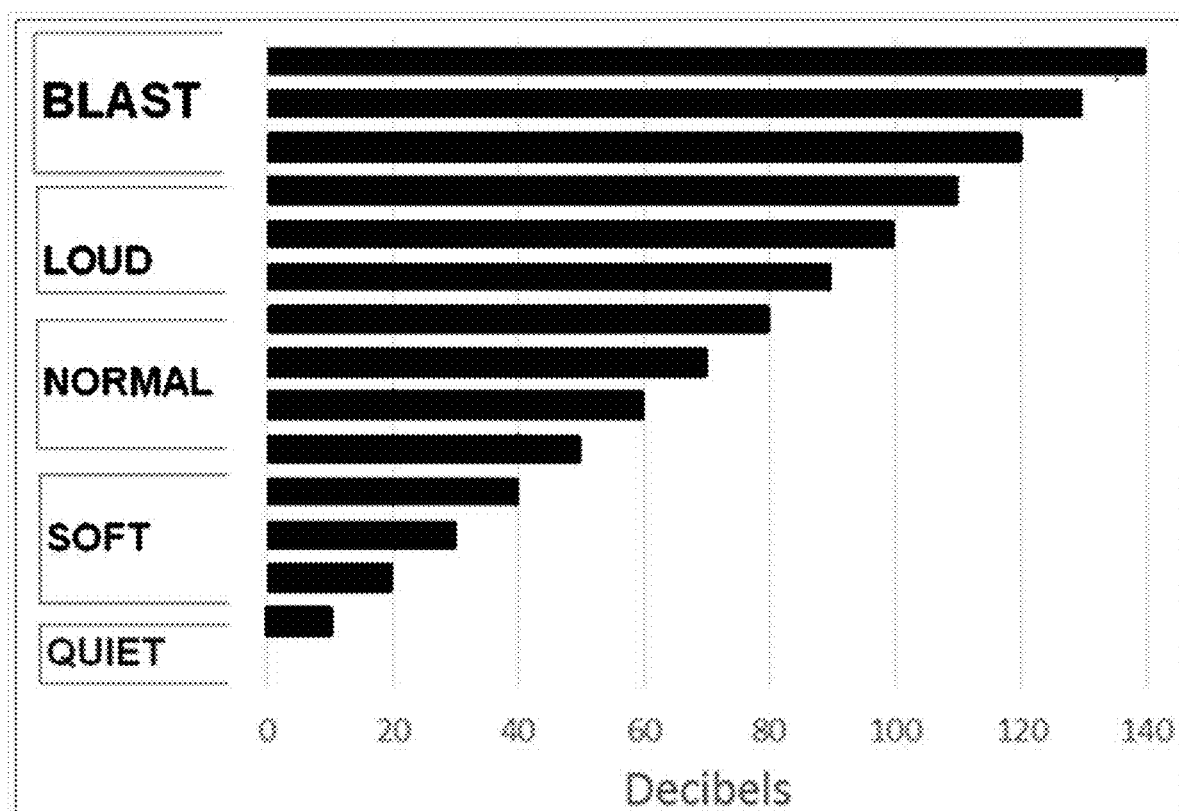
FIG. 3 is a diagram showing an example of sound volume profiles and decibel ranges.

As shown in FIG. 3, the 140 dB range is divided into plural profiles (quiet, soft, normal, loud, and blast). The profiles, stored in the memory 104 of the electronic device 100, each include an output dynamic range of expected db levels for the audio output at a volume setting corresponding to each profile as discussed above. For example, as shown in FIG. 7, there can be stored five audio output profiles and the corresponding audio output level such that for the given output level the output dynamic range is constrained within the specified corresponding range. In the example shown in FIG. 7, the quite profile has an output dynamic range of 0 dB to 15 dB, an upper sound limit of 15 dB, and an output volume level of zero (minimum), the soft profile has an output dynamic range of 15 dB to 50 dB, an upper sound limit of 50 dB, and an output volume level of seven, the normal profile has an output dynamic range of 50 dB to 70 dB, an upper sound limit of 70 dB, and an output volume level of fifteen, the loud profile has an output dynamic range of 70 dB to 120 dB, an upper sound limit of 120 dB, and an output volume level of 22, and the blast profile has an output dynamic range of 120 dB to 140 dB, an upper sound limit of 140 dB, and an output volume level of 30 (maximum). The number of profiles and the related ranges and upper limit values can be selected and can be different from those shown in the examples of FIG. 3 and FIG. 7.

For the configured output volume level the output dynamic range is constrained for the corresponding range. For example, if the output volume level is set by the user to 'Normal' or '15' then the digital audio output dynamic range is constrained within 50 dB to 70 dB.

The profiles are selected keeping in mind different viewer types. For example: an elderly user may choose the soft profile, a teenager may choose the loud profile and a middle aged user may choose the normal profile, and so on. To begin with a preferred profile selected by the user is active. For the following example, consider that the normal profile is active.

When the normal profile is active, the audio output from the television (the controlled device in this example) is expected to be in the range between 50 dB to 70 dB. The electronic device 100 (via the processor 114, and microphone 116, and other components) continuously measures the acoustic intensity level and ensures that it is within the prescribed audio output dynamic range for the selected profile.

Next, consider that the above acoustic scenario is disturbed. This is identified when the processor 114, in executing sound level extraction 204, determines that the measured acoustic intensity level is greater than the upper sound limit of the current profile. In this example, for the normal profile, the upper sound limit is 70 dB. Therefore, if the processor 114 determines that the measured acoustic intensity is higher than 70 dB, then the processor triggers execution of the Human Activity Recognition feature extraction algorithm 201. Next, the processor 114, in executing the deep learning algorithm 208, attempts to identify if the identified acoustic event is 'Voice or Conversation detected' or 'Noise'. If the processor determines that it is a conversation detected event then the processor 114 automatically changes the volume profile to the quite profile. Otherwise, if the processor determines that it is a noise detected event then the user profile is changed to a higher profile, e.g., loud or blast, according to the measured dB value of the external event. The transitioned profile remains in that setting until the end of the detected external acoustic event upon which the processor 114 changes the profile back to the normal profile that had been set by the user.

The processing includes the follow steps:
Step 1: Acoustic feature extraction for Human Activity Recognition (HAR);
Step 2: Acoustic Intensity extraction;
Step 3: Auto volume control feedback; and
Step 4: Audio output signal formatting to effect volume control within the audio signal itself.

Step 1: Acoustic Feature Extraction for Human Activity Recognition (HAR):

For this step, a deep learning algorithm such as Convolutional Neural Network (CNN) can be used. Although a deep learning algorithm eliminates the need for hand-engineered features, a representation model is necessary for description of the processing. Instead of directly using the sound file as an amplitude vs time signal, a log-scaled mel-spectrogram is used, with 128 components (bands) covering the audible frequency range (0-22050 Hz), using a window size of 23 milli-seconds (1024 samples at 44.1 kHz) and a hop size of the same duration. This conversion takes into account the fact that human beings hear sound on log-scale, and closely scaled frequencies are not well distinguished by the human cochlea. This effect becomes stronger as frequency increases. Hence, power is taken into account in terms of different frequency bands as opposed to individual frequencies. The resultant audio output from this step is represented as a 128 (frames)×128 (bands) spectrogram image (an example spectrogram 402 is shown on the top of FIG. 4). The audio-classification process is now thus transformed into an image classification process.

Figure 4:
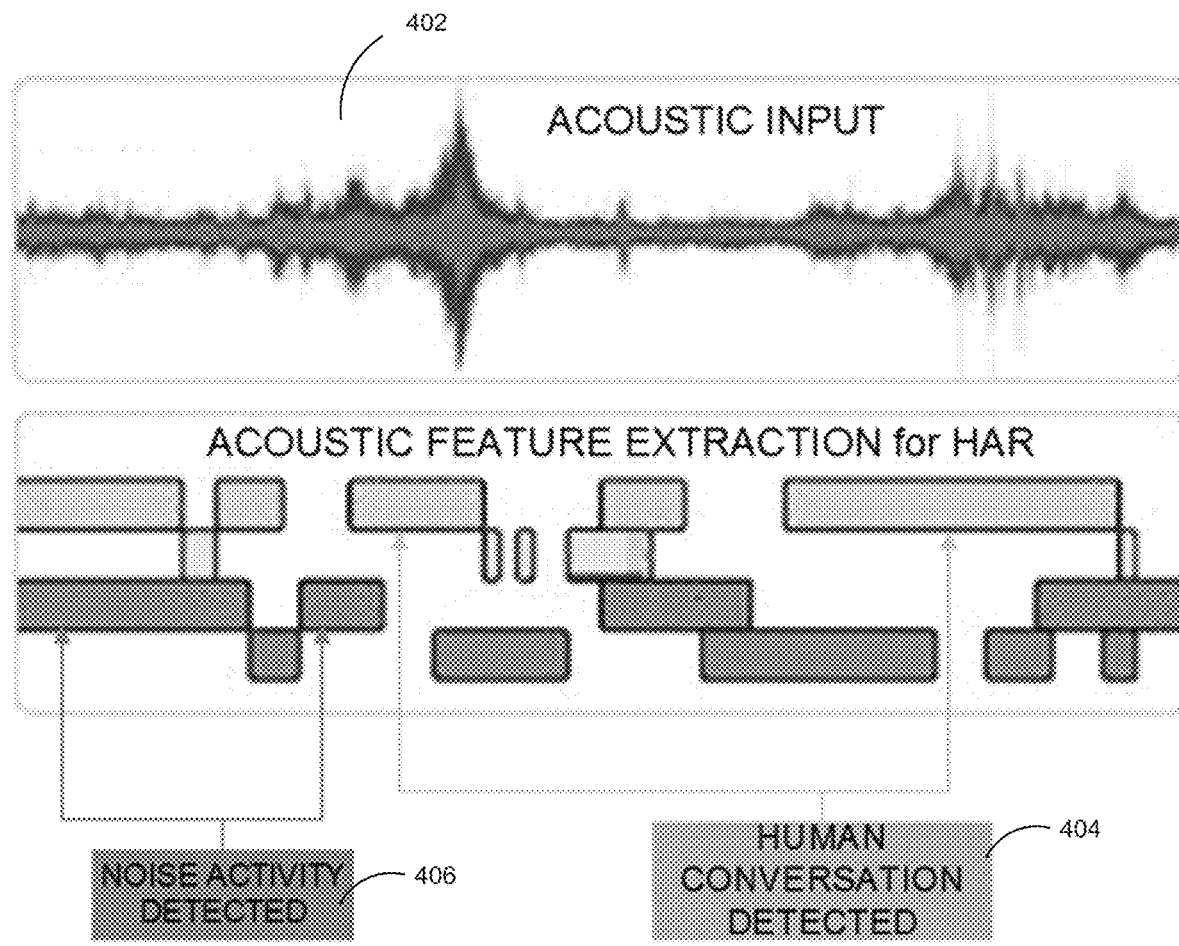
FIG. 4 illustrates a spectrogram and acoustic feature samples used for noise and voice extraction by the electronic device.

As shown in FIG. 4, the audio is in a format that is easy to process. The spectrogram image 402 of the acoustic input, at the top of FIG. 4, is input into a Convolutional Neural Network executed by the processor 114 (or plural processors 114, or the CNN is implemented externally with inputs and results communicated via the network interface 112 to an external computer/processor), for classification based on the trained Human Activity Recognition (HAR) training datasets. The input to the CNN is in 23 millisecond audio chunks. The CNN will attempt to classify each little audio slice based on the trained HAR feature set. FIG. 4 shows the following identified acoustic events from this step. Probability values ranging from '0' to '1' are assigned as follows.

Voice or Conversation detected event (e.g., 404 in FIG. 4): Threshold criteria can be set in range from 0.8 to 1, i.e., if the voice activity probability value is more than 0.8, then it is identified as voice (or conversation) event.

Noise event (e.g., 406 in FIG. 4): Threshold criteria can be set in range from 0 to 0.4, i.e., in order to satisfy the noise detected event criteria, the probability value should be less than 0.4.

Step 2: Acoustic Intensity Extraction:

The sound level extraction stage is crucial for the processing because it helps to determine if the identified HAR event is generated from the TV or an external source. The assumption here is that, based on the extracted acoustic intensity information from this stage, the processor 114 is able to determine at any given point in time whether the dB level that is measured is within the specified output dynamic range for the currently set audio profile. If the dB level of the sound input via the microphone 116 exceeds the upper sound limit of the set audio profile, the processor 114 determines that an external acoustic event has occurred which necessitates an automatic volume control action.

Step 3: Auto Volume Control Feedback:

This step combines the output path of the previous two steps. i.e., if the threshold criteria for the previous two steps is satisfied then based on the measured acoustic intensity level and type of the acoustic event identified, i.e., voice or noise, an automatic volume control feedback is initiated. For an external 'Voice' or 'Conversation' activity detected event, the processor 114 transitions the profile to the quite profile; for an external noise detected event, the processor 114 transitions the profile to the corresponding higher profile, i.e., the profile within which the measured dB values lies. Thus, if the currently in effect profile is the normal profile, and the measured dB level is 90 dB, the processor changes the profile to the loud profile, whereas if the measured dB level is 130 dB, the processor changes the profile to the blast profile.

Consider at this point the example scenario discussed above, i.e., the sound on the television is the sound of a person talking, and in the listening area there is an ambient sound (ambient noise) of a vacuum cleaner being used. According to the processing of FIG. 2, the processor 114 recognizes such a scenario as external noise and increases the television volume, i.e., the audio is changed to a higher profile. This is a two-step process as explained above, i.e., Step 2, Acoustic Intensity extraction (also referred to herein as Acoustic Learner), and Step 3, Auto Volume Control Feedback (also referred to herein as Deep Learner), and following are the steps to come to this deduction:

1. Assume the acoustic profile currently active is NORMAL, so the acoustic level should be in the range of 50 dB-70 dB.
2. Before the person in the room starts the vacuum cleaner, there is no action from the Acoustic Learner and the currently active acoustic profile is maintained.

3. However, when the person switches on the vacuum cleaner:

a. if noise from vacuum cleaner is not able increase the sound level in the room above 70 dB, then the Acoustic Learner performs no change;

b. if noise from vacuum cleaner plus the television sound is greater than 70 dB, then the Acoustic Learner needs to take an action and provide a feedback to the Deep Learner.

4. Now, according to and Step 3, Auto Volume Control Feedback, the Deep Learner receives the feedback from the Acoustic Learner indicating that the acoustic intensity of the room is above the prescribed threshold (i.e., 70 dB).

5. The Deep learner is a machine learning algorithm that is already pre-trained with similar acoustic data to be able to identify such an acoustic profile, which consists of speech plus noise from a vacuum cleaner. So, in this scenario the Deep Learner identifies the scenario as an ambient noise detection event because the noise from vacuum cleaner is stronger than the sound from the television, i.e., strong enough for the vacuum cleaner sound to cause a change in acoustic scenario of the room.

6. A frequency snapshot of this acoustic profile will indicate that the overlapping noise from the vacuum cleaner has obliterated the audio samples from the television completely in this scenario.

Though in this example we are using a vacuum cleaner which actually produces a strong noise, the Deep Learner accuracy will be very good. However, with other examples of other living room noises which may have lower intensity, or be in shorter intervals, then in such a scenario, the Deep Learner accuracy may be reduced. However, it is possible to increase the Deep Learner accuracy by providing more training data-sets. The more training data-sets that are run, the better the accuracy of the Deep Learner.

Figure 5:
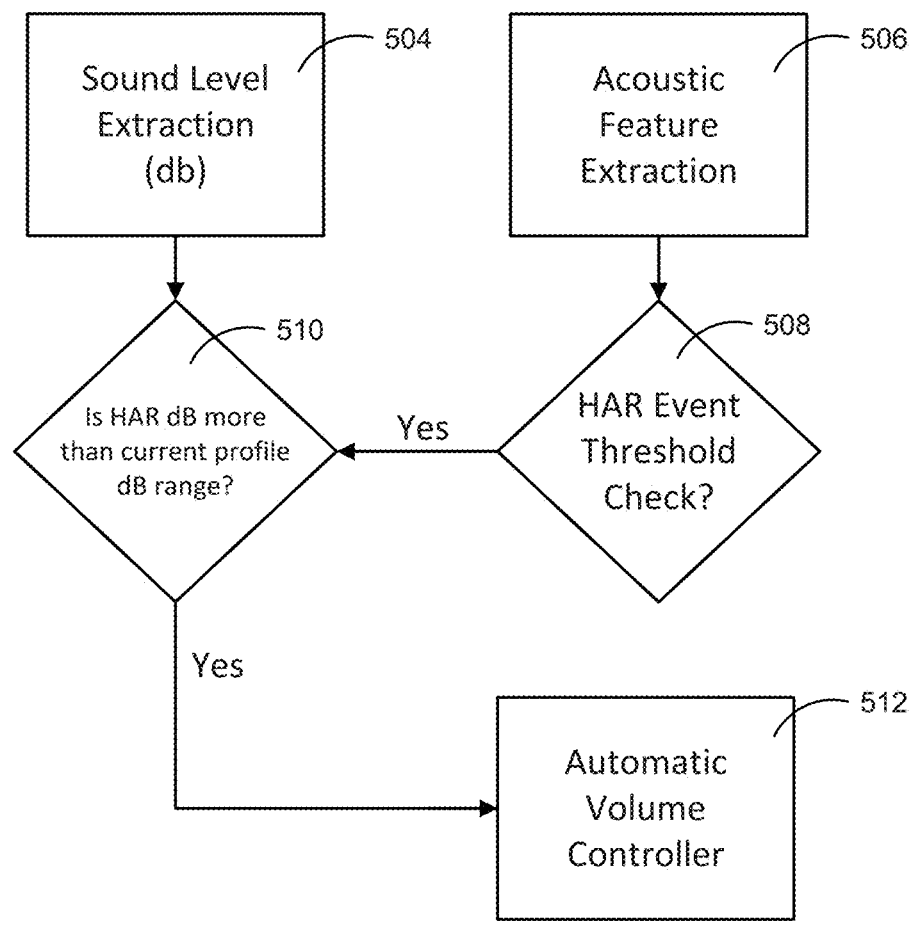
FIG. 5 is a flowchart of an example of processing executed by the electronic device.

FIG. 5 shows the processing flow resulting from the implementation of blocks 204, 206, 208, 210, and 212 (including the looped learning of blocks 208 and 201) of FIG. 2. Specifically, as shown in FIG. 5, from the acoustic feature extraction 506, an HAR event threshold is checked in block 508. If in block 508 the processor 114 determines that, yes, an HAR event has occurred, processing proceeds to block 501, in which the dB level of the sound of the HAR event is higher that the upper sound limit of the currently in-effect profile. If in block 510 the processor 114 determines that, yes, the dB level of the sound of the HAR event is higher than the upper sound limit of the currently in-effect profile, processing proceeds to the automatic volume controller 512. The automatic volume control feedback path can be fed back to a volume control module of the controlled device (television or set top box) to adjust the output volume automatically. Alternatively, as discussed below, the processor 114 in executing the automatic volume controller can directly modify the audio signal in an appropriate manner in order to implement the volume control.

The intended volume level setting determined by the processor 114 of the electronic device 100 is applied to the digital audio output bit stream of the controlled device. However, the new volume setting from the electronic device 100 cannot be directly applied or controlled from the controlled device in all scenarios. In such cases it is beneficial to be able to directly modify the digital audio signal to change the volume of the audio. To understand in detail, consider an example of how the new volume setting can be applied onto the controlled device for the below two scenarios, wherein the audio output format is PCM vs AC3.

Uncompressed Audio Format (PCM):

The application or adjustment of the volume setting for the PCM outputted waveform is implemented by the controlled device providing a dedicated register (e.g., Broadcom BCM74xx SOC) including a 13 bit register for a programmable frequency deviation value to adjust the frequency deviation (and volume) of the modulated audio signal. Independent scaling of the two audio input channels may also be used to adjust the relative volume of two audio input channels.

Compressed (AC3):

For output volume control for the compressed AC3 audio output format case, control information or "metadata" that accompanies the audio information is used and corrected to compensate for the ambient noise.

A Pre-Dolbly audio meta data bitstream decode+reencode step may be required to correct the Dolby digital meta data parameters to correct the output volume to the required decibel range accordingly to changing ambient noise environment.

Following are the Dolby digital meta data parameters that may require or undergo correction to attain the prescribed configured volume levels Dialogue level (also known as dialogue normalization or DialNorm)

The DialNorm parameter is continuously corrected (by the above mentioned pre-Dolby decode step) according to the changing ambient noise environment.

Dynamic range control (DRC)

The DRC parameter is also corrected while switching to different volume profile for ensuring highest quality audio output.

following is the mapping:—

QUIET—Heavy Compression

SOFT—Heavy Compression

NORMAL—Light Compression

Loud—None

Blast—None

While auto volume algorithm switches to the different profile, it also ensures that the corresponding DRC profile is also switched according to the above mapping.

Metadata, or data that describes the audio data, may be provided in a broadcast or recorded signal to control the playback loudness of the audio information. One example of this type of metadata is described in the Advanced Television Systems Committee (ATSC) A/52A document entitled "Revision A to Digital Audio Compression (AC-3) Standard" published Aug. 20, 2001. This particular standard specifies metadata that includes the parameters, DIALNORM, COMPR and DYNRNG, which pertain to playback signal level and dynamic range. Both signal level and dynamic range affect the perceived or subjective level of a signal, which is referred to as loudness. Receivers that conform to this ATSC audio standard use the DIALNORM parameter to control playback signal loudness levels. Decibels relative to full scale (dBFS or dBFS) is a unit of measurement for amplitude levels for the DIALNORM parameter, which have a defined maximum peak level. FIG. 6 illustrates an example of modified DIALNORM settings to be encoded into the AC3 metadata field for the desired volume level determined by the processor 114 for the AC3 formatted audio output. Thus, as shown in FIG. 6, the six different levels 1-6 have the values:

1: modified DialNorm setting 0 dBFS and desired volume level 0;

2: modified DialNorm setting −1 dBFS and desired volume level 1;

3: modified DialNorm setting −5 dBFS and desired volume level 5;

4: modified DialNorm setting −10 dBFS; desired volume level 10 (Normal);

5: modified DialNorm setting −20 dBFS; desired volume level 20;

6: modified DialNorm setting −31 dBFS; desired volume level 31.

The above may be implemented as any combination of an apparatus, a system, an integrated circuit, and a computer program on a non-transitory computer readable recording medium. The one more processor may be implemented as an integrated circuit (IC), an application specific integrated circuit (ASIC), or large-scale integrated circuit (LSI), system LSI, super LSI, or ultra LSI components that perform a part or all of the functions described herein.

The techniques to adjust the audio output volume for PCM and Dolby audio are described above as per the presently available standard or techniques. However, suitable corrections or update can be made in future as per the evolving DOLBY spec changes (for existing or new meta data parameter) or to any latest available PCM control features to effectively control or modify the output audio volume.

The processes disclosed above constitute algorithms that can be effected by software, applications (apps, or mobile apps), or computer programs. The software, applications, computer programs can be stored on a non-transitory computer-readable medium for causing a computer, such as the one or more processors, to execute the processes described herein and shown in the drawing figures.

The term non-transitory computer-readable recording medium refers to any computer program product, apparatus or device, such as a magnetic disk, optical disk, solid-state storage device, memory, programmable logic devices (PLDs), DRAM, RAM, ROM, EEPROM, CD-ROM or other optical disk storage, magnetic disk storage or other magnetic storage devices, or any other medium that can be used to carry or store desired computer-readable program code in the form of instructions or data structures and that can be accessed by a general-purpose or special-purpose computer, or a general-purpose or special-purpose processor. Disk or disc, as used herein, includes compact disc (CD), laser disc, optical disc, digital versatile disc (DVD), floppy disk and Blu-ray disc. Combinations of the above are also included within the scope of computer-readable media.

What we claim is:

1. An automatic volume control apparatus for automatically controlling an output volume of audio content, comprising:
   a memory;
   a processor configured to execute at least the following:
      receiving a user volume setting, wherein a first profile having a first decibel (dB) band is associated with the user volume setting, and wherein the first dB band has a first upper sound limit value;
      setting an output volume of the audio content to a volume setting based on the received user volume setting;
      receiving listening area audio;
      determining whether the listening area audio has an acoustic intensity level that exceeds an upper sound limit value associated with the first profile;
      after determining that the listening area audio has an intensity that exceeds the first upper sound limit value associated with the first profile, performing an analysis of the listening area audio to determine that the listening area audio includes noise or an ambient voice; and
      changing the output volume of the audio content based on the performing the analysis to a volume associated with a second profile having a second dB band.

2. The automatic volume control apparatus according to claim 1, wherein the processor is further configured to execute the following:
   determining that the listening area audio includes noise; and
   wherein the second dB band is a higher dB band above the first dB band.

3. The automatic volume control apparatus according to claim 1, wherein the processor is further configured to execute the following:
   determining that the listening area audio includes an ambient voice; and
   wherein the second dB band is a lower dB band below the first dB band.

4. An automatic volume control method for automatically controlling an output volume of audio content, comprising:
   receiving a user volume setting, wherein a first profile having a first decibel (dB) band is associated with the user volume setting, and wherein the first dB band has a first upper sound limit value;
   setting an output volume of the audio content to a volume setting based on the user volume setting;
   determining, with a processor, whether listening area audio has an acoustic intensity level that exceeds an upper sound limit value associated with the first profile;
   after determining that the listening area audio exceeds the first upper sound limit value associated with the first profile, performing, with the processor, an analysis of the listening area audio to determine that the sound input from the microphone includes noise or an ambient voice;
   automatically changing the output volume of the audio content based on the performing the analysis to a volume associated with a second profile having a second dB band.

5. The automatic volume control method according to claim 4, further comprising:
   determining that the listening area audio includes noise;
   wherein the second dB band is a higher dB band above the first dB band.

6. The automatic volume control method according to claim 4, further comprising:
   determining that the listening area audio includes an ambient voice;
   wherein the second dB band is a lower dB band below the first dB band.

7. A non-transitory computer readable medium having stored thereon a program that causes a processor to execute an automatic volume control method for automatically controlling an output volume of audio content, comprising:
   receiving a user volume setting, wherein a first profile having a first decibel (dB) band is associated with the user volume setting, and wherein the first dB band has a first upper sound limit value;
   setting an output volume of the audio content to a volume setting based on the user volume setting;
   determining, with a processor, whether the listening area audio has an acoustic intensity level that exceeds an upper sound limit value associated with the first profile;
   after determining that the listening area audio exceeds the first upper sound limit value associated with the first profile, performing, with the processor, an analysis of the listening area audio to determine that the listening area audio includes noise or an ambient voice;

automatically changing the output volume of the audio content based on the performing the analysis to a volume associated with a second profile having a second dB band.

8. The non-transitory computer readable medium according to claim 7, wherein the program causes the processor to further execute the following:

determining that the listening area audio includes noise;

wherein the second dB band is a higher dB band above the first dB band.

9. The non-transitory computer readable medium according to claim 7, wherein the program causes the processor to further execute the following:

determining that the listening area audio includes an ambient voice;

wherein the second dB band is a lower dB band below the first dB band.

* * * * *